(12) United States Patent
Goswami et al.

(10) Patent No.: US 11,468,218 B2
(45) Date of Patent: Oct. 11, 2022

(54) INFORMATION THEORETIC SUBGRAPH CACHING

(71) Applicant: Synopsys, Inc., Mountain View, CA (US)

(72) Inventors: Dhiraj Goswami, Wilsonville, CA (US); Ngai Ngai William Hung, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 1438 days.

(21) Appl. No.: 13/766,749

(22) Filed: Feb. 13, 2013

(65) Prior Publication Data

US 2014/0068533 A1 Mar. 6, 2014

Related U.S. Application Data

(63) Continuation-in-part of application No. 13/596,776, filed on Aug. 28, 2012, now Pat. No. 9,720,792.

(51) Int. Cl.
*G06F 30/30* (2020.01)
*G06F 30/33* (2020.01)
*G06F 30/3323* (2020.01)

(52) U.S. Cl.
CPC .............. *G06F 30/30* (2020.01); *G06F 30/33* (2020.01); *G06F 30/3323* (2020.01)

(58) Field of Classification Search
CPC . G06F 17/504; G06F 17/5022; G06F 17/5045
See application file for complete search history.

(56) References Cited

U.S. PATENT DOCUMENTS 5,432,707 A 7/1995 Leung
5,590,049 A 12/1996 Arora
(Continued)

OTHER PUBLICATIONS

L. G. Jones and D. T. Blaauw, "A cache-based method for accelerating switch-level simulation," in IEEE Transactions on Computer-Aided Design of Integrated Circuits and Systems, vol. 13, No. 2, pp. 211-218, Feb. 1994.*

(Continued)

*Primary Examiner* — Boris Gorney
*Assistant Examiner* — Robert S Brock
(74) *Attorney, Agent, or Firm* — Weaver Austin Villeneuver & Sampson LLP (57) ABSTRACT

Computer-implemented techniques are disclosed for verifying circuit designs using subgraph caching. A device under test (DUT) is modeled as a graph. The graph is partitioned into one or more subgraphs and problems are generated for each subgraph. Graph and subgraph problem generation is repeated numerous times throughout the verification process. Problems and sub-problems are generated and solved. When a subgraph problem is solved, the problem's variables, values, and information can be stored in a cache. The storage can be based on entropy of variables used in the graph and subgraph problems. The subgraph problem storage cache can be searched for previously stored problems which match another problem in need of a solution. By retrieving subproblem variables, values, and information from the cache, the computational overhead of circuit design verification is reduced as problems are reused. Caching can be accomplished using an information theoretic approach.

26 Claims, 6 Drawing Sheets

(56) References Cited

U.S. PATENT DOCUMENTS

| | | | |
|---|---|---|---|
| 5,630,051 | A | 5/1997 | Sun et al. |
| 5,761,487 | A | 6/1998 | Yuguchi |
| 5,971,596 | A | 10/1999 | Nishikawa |
| 6,065,063 | A | 5/2000 | Abali |
| 6,212,668 | B1 | 4/2001 | Tse et al. |
| 6,219,809 | B1 | 4/2001 | Noy |
| 6,339,837 | B1 | 1/2002 | Li |
| 6,378,096 | B1 | 4/2002 | Chakradhar et al. |
| 6,519,727 | B2 | 2/2003 | Noy |
| 6,609,230 | B1 | 8/2003 | Li |
| 6,684,359 | B2 | 1/2004 | Noy |
| 6,792,587 | B2 | 9/2004 | Xing et al. |
| 6,918,076 | B2 | 7/2005 | Lagoon et al. |
| 6,920,584 | B2 | 7/2005 | Phelps et al. |
| 6,993,730 | B1* | 1/2006 | Higgins ............... G06F 17/504 716/107 |
| 7,003,749 | B2 | 2/2006 | Subasic et al. |
| 7,107,553 | B2 | 9/2006 | Lockyear et al. |
| 7,114,111 | B2 | 9/2006 | Noy |
| 7,191,107 | B2 | 3/2007 | Andrzejak et al. |
| 7,194,713 | B2 | 3/2007 | Iwashita |
| 7,222,317 | B1 | 5/2007 | Mathur et al. |
| 7,257,786 | B1 | 8/2007 | Kukula |
| 7,257,808 | B2 | 8/2007 | Robison |
| 7,260,562 | B2 | 8/2007 | Czajkowski et al. |
| 7,266,534 | B2 | 9/2007 | Emek et al. |
| 7,284,177 | B2 | 10/2007 | Hollander et al. |
| 7,290,193 | B2 | 10/2007 | Kadkade et al. |
| 7,292,904 | B2 | 11/2007 | Denton et al. |
| 7,315,996 | B2 | 1/2008 | Baumgartner et al. |
| 7,333,968 | B2 | 2/2008 | Geller et al. |
| 7,343,482 | B2 | 3/2008 | Biles et al. |
| 7,373,621 | B1 | 5/2008 | Dastidar |
| 7,383,519 | B2 | 6/2008 | Iwamura |
| 7,386,521 | B2 | 6/2008 | Adir et al. |
| 7,409,377 | B2 | 8/2008 | Emek et al. |
| 7,409,656 | B1 | 8/2008 | Ruehl |
| 7,509,605 | B2 | 3/2009 | Baumgartner et al. |
| 7,530,036 | B2 | 5/2009 | Nahir et al. |
| 7,606,776 | B1 | 10/2009 | Havens et al. |
| 7,613,973 | B2 | 11/2009 | Lagoon et al. |
| 7,617,468 | B2 | 11/2009 | Thakur et al. |
| 7,685,554 | B1 | 3/2010 | Kelly et al. |
| 7,742,907 | B2 | 6/2010 | Gupta et al. |
| 7,761,818 | B2 | 7/2010 | Gray et al. |
| 7,779,378 | B2 | 8/2010 | Baumgartner et al. |
| 7,788,616 | B2 | 8/2010 | Baumgartner et al. |
| 7,793,242 | B2 | 9/2010 | Baumgartner et al. |
| 7,797,123 | B2 | 9/2010 | De et al. |
| 7,870,523 | B1 | 1/2011 | Uziel et al. |
| 8,020,122 | B2 | 9/2011 | Cheng et al. |
| 8,020,125 | B1 | 9/2011 | Kuehlmann et al. |
| 8,042,086 | B2 | 10/2011 | Tseng |
| 8,046,206 | B1 | 10/2011 | Hood, III et al. |
| 8,065,255 | B2 | 11/2011 | Colena et al. |
| 8,099,690 | B2 | 1/2012 | Goswami et al. |
| 8,099,695 | B1 | 1/2012 | Lehavot et al. |
| 8,099,696 | B2 | 1/2012 | Lehavot et al. |
| 8,104,001 | B2 | 1/2012 | Lehavot et al. |
| 8,108,745 | B2 | 1/2012 | Kikta et al. |
| 8,150,787 | B2 | 4/2012 | Maturana |
| 8,190,416 | B2 | 5/2012 | Mead |
| 8,230,263 | B2 | 7/2012 | Mukherjee et al. |
| 8,255,848 | B2 | 8/2012 | Baumgartner et al. |
| 8,296,697 | B2 | 10/2012 | Gal et al. |
| 8,302,062 | B2 | 10/2012 | Gray et al. |
| 8,316,332 | B1 | 11/2012 | Goyal et al. |
| 8,386,974 | B2 | 2/2013 | Biswas et al. |
| 8,413,089 | B2 | 4/2013 | Qiang et al. |
| 8,413,099 | B2 | 4/2013 | Mottaez et al. |
| 8,863,067 | B1* | 10/2014 | Caldwell ............... G06F 17/5031 716/132 |
| 9,665,630 | B1* | 5/2017 | Bigman ............... G06F 3/061 |
| 9,720,792 | B2* | 8/2017 | Goswami ............... G06F 11/263 |
| 2003/0115035 | A1* | 6/2003 | Kulshreshtha ...... G06F 17/5022 703/19 |
| 2004/0216097 | A1* | 10/2004 | Sun ............... G06F 12/0891 717/154 |
| 2006/0247930 | A1 | 11/2006 | Iyer |
| 2007/0005533 | A1 | 1/2007 | Iyer et al. |
| 2007/0005901 | A1* | 1/2007 | Kellar ............... G06F 12/0886 711/137 |
| 2007/0157187 | A1 | 7/2007 | Cheng et al. |
| 2007/0220235 | A1 | 9/2007 | Yehia et al. |
| 2007/0239969 | A1 | 10/2007 | Biles et al. |
| 2008/0235640 | A1 | 9/2008 | Gal et al. |
| 2009/0031259 | A1 | 1/2009 | Gray et al. |
| 2009/0132975 | A1 | 5/2009 | Cheng et al. |
| 2009/0204930 | A1* | 8/2009 | Cohn ............... G06F 17/5072 716/55 |
| 2009/0222791 | A1 | 9/2009 | Togawa |
| 2009/0249004 | A1* | 10/2009 | Wang ............... G06F 12/0875 711/162 |
| 2009/0254874 | A1* | 10/2009 | Bose ............... G06F 17/5068 716/113 |
| 2009/0281781 | A1* | 11/2009 | Rose ............... G06F 17/5036 703/14 |
| 2009/0319252 | A1 | 12/2009 | De et al. |
| 2010/0017352 | A1* | 1/2010 | Maturana ............... G06N 5/003 706/46 |
| 2010/0121802 | A1* | 5/2010 | Colena ............... G06N 5/04 706/46 |
| 2010/0191679 | A1 | 7/2010 | Hung et al. |
| 2010/0218149 | A1 | 8/2010 | Sasaki |
| 2010/0223266 | A1 | 9/2010 | Balmin et al. |
| 2010/0257494 | A1* | 10/2010 | Pouarz ............... G06F 17/504 716/111 |
| 2010/0275169 | A1* | 10/2010 | Goswami ............... G06F 17/504 716/103 |
| 2010/0293513 | A1* | 11/2010 | Baumgartner ........ G06F 17/505 716/103 |
| 2010/0325593 | A1 | 12/2010 | Zavadsky et al. |
| 2011/0067016 | A1 | 3/2011 | Mizrachi et al. |
| 2011/0196642 | A1 | 8/2011 | Newcomb |
| 2012/0017189 | A1* | 1/2012 | Durbha ............... G06F 17/5045 716/113 |
| 2012/0136635 | A1 | 5/2012 | Hung et al. |
| 2012/0151431 | A1* | 6/2012 | Huijbregts ............ G06F 17/505 716/131 |
| 2012/0159409 | A1* | 6/2012 | Guo ............... G06F 17/504 716/106 |
| 2012/0253754 | A1 | 10/2012 | Goswami et al. |
| 2012/0278675 | A1 | 11/2012 | Qiang et al. |
| 2012/0317525 | A1* | 12/2012 | Chapman ............ G06F 17/5045 716/102 |
| 2014/0040849 | A1* | 2/2014 | Wecker ............... G06F 17/5022 716/132 |
| 2015/0046385 | A1* | 2/2015 | Shimizu ............... G06F 3/0653 706/52 |
| 2015/0220671 | A1* | 8/2015 | Acar ............... G06F 17/5036 716/106 |
| 2018/0067863 | A1* | 3/2018 | Ki ............... G06F 12/126 |

OTHER PUBLICATIONS

Wikipedia Contributors, "Entropy (information theory)," Wikipedia, The Free Encyclopedia, as archived on Aug. 18, 2011, 17 pages, retrieved from https://en.wikipedia.org/w/index.php?title=Entropy_(information_theory)&oldid=445569744 on Mar. 7, 2016.*

Hema Narasimhadevara, An information theoretic rents rule, MS Thesis, Oregon Health & Science University, 51 pages, 2004.*

G. Pandurangan and W. Szpankowski, "A universal online caching algorithm based on pattern matching," Information Theory, 2005. ISIT 2005. Proceedings. International Symposium on, Adelaide, SA, 2005, pp. 1151-1155.*

"cache." In High Definition: A-Z Guide to Personal Technology. Houghton Mifflin, 2006. 2 pages. Obtained from https://search.credoreference.com/content/entry/hmhighdef/cache/0?institutionId=743 on Jun. 11, 2018 (Year: 2006).*

(56) References Cited

OTHER PUBLICATIONS

Chang, et al. "Synthesis with External Don't-Cares Using Shannon Entropy and Craig Interpolation." In Proc. International Workshop on Logic and Synthesis (IWLS). 2008. 8 pages (Year: 2008).*
VLSI Physical Design: From Graph Partitioning to Timing Closure, Kahng, et al., ISBN 978-90-481-9591-6, Ch.8, pp. 1-74.
MOUHOUB et ai, "Heuristic techniques for variable and value ordering in CSPs," Proceeding GECCO '11, Proceedings of the 13th annual conference on Genetic and evolutionary computation, pp. 457-464, (2011).
U.S. Appl. No. 13/596,776, Advisory Action mailed Oct. 6, 2015.
U.S. Appl. No. 13/596,776, Final Office Action mailed 67-22-2615.
U.S. Appl. No. 13/596,776, Non-Finai Office Action mailed 61-69-2615.
U.S. Appl. No. 13/596,776, Non-Finai Office Action mailed 06-02-201 6.
U.S. Appl. No. 13/596,776, Notice of Allowance mailed 63-27-2617.
U.S. Appl. No. 13/596,776, Notice of Allowance mailed 12-21-2616.

* cited by examiner

INFORMATION THEORETIC SUBGRAPH CACHING

RELATED APPLICATIONS

This application is also a continuation-in-part of "Information Theoretic Caching for Dynamic Problem Generation in Constraint Solving" U.S. patent application Ser. No. 13/596,776, filed Aug. 28, 2012. The foregoing application is hereby incorporated by reference in its entirety.

FIELD OF ART

This application relates generally to semiconductor circuits and more particularly to subgraph generation and caching techniques.

BACKGROUND

Without integrated circuits, the electronic devices and systems that pervade modern life would not exist. Integrated circuits form the foundation of many modern systems and devices. Designing integrated circuits, however, has become an exceptionally difficult and expensive process. The many, and possibly divergent, market demands require that the design process yield functionally correct hardware efficiently, quickly and cost effectively. Architectural and fabrication complexities, high circuit densities, tight power budgets, heat dissipation constraints, and so on, all further complicate design. To handle electronic system design complexity, designers create a design specification to which their electronic systems are designed. The specification is created to balance the many disparate system demands required of the electronic system, and to contain otherwise unmanageable design complexity. For a design to be considered valid, the design must prove, by passing a verification test, that it meets or exceeds each of the many and diverse requirements of the design specification. Since such design verification needs to determine whether the function of a proposed circuit design conforms to a specification, extensive analysis and numerous checks are required to ensure compliance. A circuit's ability to successfully meet a specification ensures the proper operation of both the circuit in question and the system as a whole. In order to perform such verification, various tools are used, including circuit simulators, logic simulators, static verification tools, and graphical problem solvers. Since the detailed evaluation of entire circuits is a process too complex and expensive to be viable, circuit designers have employed various approaches to verification that maximize evaluation coverage and effectiveness. For example, traditional verification methods are based on test benches. Test benches employ a verification technique that functions by applying sequences of known test vectors to a circuit's inputs and monitoring the test results at the circuit's outputs. If the circuit outputs expected values when fed a specific set of input values, the input values are thought to function correctly. Other verification techniques rely on solving graph problems representing circuits under test. Traditional approaches have become less efficient because of increased test duration required to test complex and difficult-to-verify modern circuit designs. Further, current methods do not scale to large electronic systems comprising, perhaps, hundreds of millions of devices. Thus, improved verification approaches are required.

Implementing a design that matches its system specification is a highly complex and time-consuming process. Design analysis typically is based on a test bench which employs a range of tools with which to evaluate the integrated circuit. Tools may examine a circuit at different levels of abstraction, including the gate level, transistor level, layout level, high level (RTL), and so on. Tools may also examine graphical representations of a circuit. At each level, tools are employed to test designs against a specification. Tests are chosen based on the tools used and on the requirements specified by a given circuit's design size and design complexity. In each testing method, tests which will sufficiently examine the device under test (DUT) are chosen. In order to maximize test efficacy, the test must check all aspects of the DUT. If performed correctly, a circuit designer chooses tests that verify that a circuit design will work for its intended purpose. The testing process is becoming increasingly complex because system size and design complexity continue to expand. In addition, different design techniques, methodologies and standards drive tests which cater to different systems requirements. The generation of stimuli for the design under test (DUT) requires careful selection of appropriate values in order to provide coverage throughout the possible solution space. Producing uniformly distributed stimuli across a solution space is difficult, and implementing the stimuli to verify a design presents further significant challenges, including substantial runtime and memory usage inefficiencies. Thus, a test solution which improves runtime and memory efficiencies is highly desirable.

SUMMARY

Techniques implemented to improve design implementation are required to identify and cache subgraphs which are used for solving problems related to integrated circuit design. A graph representing a circuit is partitioned into one or more subgraphs. The subgraph problems are then solved. The one or more subgraphs are cached for future use. Caching problems solved based on the subgraphs permits reuse of previously solved problems, thus increasing efficiency and decreasing computational load. A computer-implemented method for design analysis is disclosed comprising: determining a graph for a semiconductor circuit design; partitioning the graph into subgraphs; solving a design problem for one or more subgraphs; and caching information on the one or more subgraphs into subgraph storage.

The method may further comprise searching through the subgraph storage to identify a previously cached subgraph which matches a second design problem. The method may further comprise retrieving a solution, from subgraph storage, for the previously cached subgraph which matches the second design problem. The determining the graph may be based on logic components and connections between the logic components within the semiconductor circuit design. The design problem may include one or more of timing, power, or area. The partitioning may group one or more logic components into a subgraph. The partitioning may be based on hierarchy. The partitioning may be accomplished after flattening of the semiconductor circuit design. The partitioning may be based on a cut through the graph. The caching may store information about a subgraph. The information about the subgraph may include variables and values for the variables. The variables and the values may be applied through a hierarchy within the semiconductor circuit design and the information which is cached may be selected based on a frequency with which the variables are used. The information about the subgraph may include information on one or more of timing, power, or area. The information on timing may include one or more of setup time, hold time, access time, or cycle time. The design problem may include analysis of arrival time and slack time. The information on power may include one or more of standby power, leakage power, dynamic power, power-down power, or static power. The information on area may include one or more of metallization area, diffusion area, or polysilicon area. The caching may be based on information content about the subgraph. The information content may be based on evaluating changes in the information content. The caching may be based on entropy evaluation of the information content. The entropy evaluation may include Shannon entropy. The method may further comprise obtaining the design for which a graph is to be determined.

In embodiments, a computer-implemented method for design analysis may comprise: determining a graph for a semiconductor circuit design wherein the graph describes interaction between logic components within the semiconductor circuit design; partitioning the graph into subgraphs where the subgraphs describe portions of the semiconductor circuit design; solving a design problem for one or more subgraphs within the semiconductor circuit design; caching information on the one or more subgraphs into subgraph storage; searching through the subgraph storage to identify a previously cached subgraph which matches a second design problem; and retrieving a solution, from subgraph storage, for the previously cached subgraph which matches the second design problem wherein the solution is used to solve an overall design problem for the semiconductor circuit design. In some embodiments, a computer system for design analysis may comprise: a memory which stores instructions; one or more processors coupled to the memory wherein the one or more processors are configured to: determining a graph for a semiconductor circuit design; partitioning the graph into subgraphs; solving a design problem for one or more subgraphs; and caching information on the one or more subgraphs into subgraph storage. In embodiments, a computer program product embodied in a non-transitory computer readable medium for design analysis may comprise: code for determining a graph for a semiconductor circuit design; code for partitioning the graph into subgraphs; code for solving a design problem for one or more subgraphs; and code for caching information on the one or more subgraphs into subgraph storage.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Semiconductor design involves solving numerous problems across various portions of a design. The many design problems of interest may include those related to timing, power, area, routing, and other problems which may be represented graphically. Timing problems, for example, include a range of time specifications such as delay time, arrival time, hold time, jitter, and other critical and required timing constraints. Since modern systems may now comprise tens or even hundreds of millions of active devices, such a design process is a complex, computationally intensive, and time-consuming undertaking One powerful technique which meets computational efficiency requirements is based on graph theory for circuit simulation. Graphical analysis uses techniques which begin with converting a circuit into a graphical representation of the circuit. Graphs are partitioned into subgraphs, and problems associated with the subgraphs are generated and solved. However, because of the increased device count and system complexity, the graphs necessarily become large and complex. Instead, more advanced techniques are required for the simulation problems to become tractable.

Design of an electronic system using graphical representations requires mapping circuits to graphs. The nodes and edges of a graph may represent the nodes and branches in a circuit—in such a system, a node in a circuit corresponds to a node in a graph, and electrical elements of the circuit branches correspond to the edges of the graph. A graph is partitioned into subgraphs, which represent subsections of the graphs. The subgraphs may represent trees of the graph. The process to simulate the circuit involves generating simulation problems based on the subgraphs. This process of "problem generation" is repeated many times throughout the evaluation process. For every call to solve a graph, several process steps are required. In addition, every step in the problem generation process creates problems and sub-problems which must be determined, manipulated, and stored, creating significant computational and storage requirements. However some of the problems, sub-problems, or problem components which result from the graphs and subgraphs, recur during the design process. The determination, manipulation, and storage of these subgraphs are redundant if these subgraphs are unnecessarily regenerated and rewritten to memory. Therefore, finding a method able to determine which subgraphs are likely to be reused, and locate those repeating subgraphs using effective storage and retrieval methods, is highly desirable. Such a method would significantly reduce computational and storage requirements through reuse while simultaneously improving verification speed and efficiency. It should be understood that the disclosed concepts apply to other types of subgraph problem generation and solving beyond semiconductor design. Semiconductor timing, power optimization, area optimization, interconnect routing, and numerous other computational problems may be evaluated using these techniques.

Figure 1:
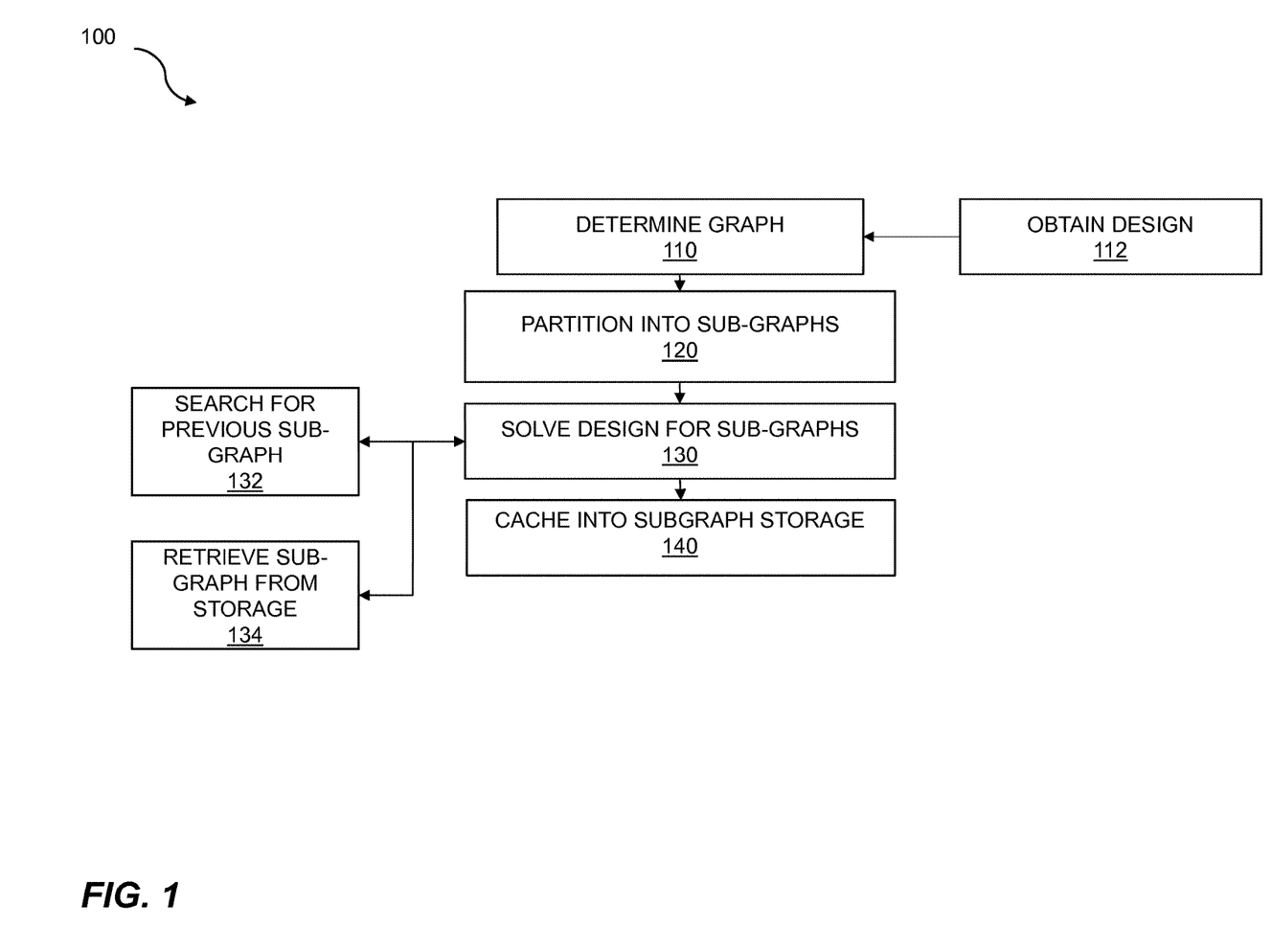
FIG. 1 is a flow diagram for subgraph caching.

FIG. 1 is a flow diagram for subgraph caching. A flow 100 is described for a computer-implemented method for design analysis. Since modern electronic systems are comprised of as many as tens to hundreds of millions of electronic devices, system design has become a highly complex, time consuming, and costly venture. Graphs which represent the design are often generated for design purposes, but the graphs themselves large and complex. The graphs may be partitioned into subgraphs to reduce graph complexity since subgraphs are smaller and may be more easily analyzed. The subgraphs often represent common components, sub-systems, and systems of the DUT.

The design problems may include one or more of timing, power, or area. A graph is partitioned into one or more subgraphs to reduce problem size and computational complexity. Problems are generated to solve the one or more subgraphs. Because each problem requires computational and storage resources, a method capable of implementing subgraph identification and reuse is highly desirable. Reducing computational and storage requirements while speeding verification time is critical to the successful verification of an electronic system. Thus, a design method which employs problem reuse to significantly reduce computational and storage requirements while improving efficacy and speed is critical to successful electronic system design.

The flow 100 includes determining a graph 110 for a semiconductor circuit design. A graph representing the circuit may include edges and nodes; arcs and vertices; tokens, places, and transitions; or another appropriate graphical representation of the circuit. The flow 100 may further comprise obtaining a design 112 for which a graph is to be determined. The design may be obtained from a computer aided design tool or other computer aided tool, already loaded into the simulation tool, and so on. The design information may be written in any of a variety of design languages including SPICE™, Verilog™, VHDL™, SystemVerilog™, SystemC™, Vera™, e™, or another design language. A design automation tool may generate the graphs. The graph may be used in a verification process for a semiconductor circuit, in a timing analysis for the semiconductor circuit, or in some other type of simulation problem, including power, area, routing, and so on.

The flow 100 includes partitioning the graph into subgraphs 120. A graph representing a DUT may be large and complex, depending on the size and complexity of the DUT. The DUT may represent a semiconductor circuit or a portion of a semiconductor circuit. The graph may be partitioned into one or more subgraphs. The partitioning may group one or more logic components into a subgraph. The logic components may be simple logic circuits, or may represent more complex logic subsystems or systems. The partitioning may be based on hierarchy. The hierarchy may be based on a logic hierarchy; for example, repeated cells within a subsystem, functional blocks of a subsystem, a system, and so on. The subgraphs may represent trees or subtrees of a graph. The partitioning may be based on a cut through the graph. A cut through a graph may be made to partition a graph into completely separate parts. The subgraphs may be used for verification purposes. The subgraphs may be of varying sizes; the size of the subgraph may be chosen for convenience of simulation. The subgraph may include portions of a DUT. The one or more subgraphs may include portions of a semiconductor circuit including subcircuits, circuits, subsystems, systems, and so on. The partitioning may be accomplished after flattening the semiconductor circuit design. Flattening may involve resolving all references to logic cells, subsystems, systems, and the like. Flattening a semiconductor circuit design may result in increased computation efficiency by reducing or eliminating calls to referenced cells.

The flow 100 includes solving a design problem 130 for one or more subgraphs. The problem solving may include analysis of a variety of design problems related to a semiconductor circuit simulation problem including timing, power, area, routing, and so on. The design problem may include analysis of arrival time and slack time. A variety of techniques may be used for solving one or more design problems related to the one or more subgraphs. For example, a connectivity matrix where the circuit element for each branch of the DUT is recorded for each edge of the graph may be generated. Similarly, linear-equation solutions may be applied. In embodiments, solving a design or designs for one or more subgraphs includes searching for a previously solved subgraph 132. A previously solved subgraph may have been stored based on variables and values related to the subgraph. The previously solved subgraph may have been hierarchically stored. A previously solved subgraph may be stored based on a hashing scheme, an entropy scheme, and so on. When a previously solved graph is found, the solution is retrieved from storage 134. This retrieval of a previously solved subgraph allows the design problem for the subgraph to be solved without recomputation. Using the previously solved subgraph reduces computational overheard by eliminating redundant re-solving for the design for the subgraph.

The flow 100 includes caching information on the one or more subgraphs into subgraph storage 140. Solving designs for one or more subgraphs may produce variables and values. If a later solution to a design for a subgraph were to solve the same subgraph, then the same variables, and possible values, are likely to result. Therefore, previously solved designs for subgraphs may be placed into subgraph storage or cached for future reuse. The caching may store information about a subgraph. Various types of information related to a subgraph may be stored, including design specification, circuit context information, and the like. The information about the subgraph may include variables and values for the variables. One or more variables may be stored, and values related to the variables may be stored. In some cases the variables and the values are applied through a hierarchy within the semiconductor circuit design and the information which is cached is selected based on a frequency with which the variables are used. Example values which may be stored include numbers, characters, text, and so on. The information about the subgraph may include information on one or more of timing, power, area, and so on. Each of the information types may include one or more pieces of information. For example, the information may include details about area and power constraints placed on a circuit, subsystem, system, and so on. The information on timing may include one or more of setup time, hold time, access time, or cycle time. Other information on timing may include jitter, skew, slew, propagation delay, and so on. The information on power may include one or more of standby power, leakage power, dynamic power, power-down power, or static power. Information on power may include power budgets for subcells, cells, subsystems, systems, and so on. The information on area may include one or more of metallization area, diffusion area, or poly silicon area. Other information on area may include cell area, subsystem area, system area, and so on. Area information may include specifications on whether or not the area is a fixed shape. The caching may include storing the previously solved design for a subgraph along with variables, values and other information about the subgraph. The information content may be based on evaluating changes in the information content. For example, the solving of a subgraph problem may result in new information to be cached. Various techniques may be used to determine whether a solved subgraph should or should not be cached. Numerous caching schemes exist, including caching based on an entropy evaluation of the information content. For example, variables and values which are likely to change signify high entropy, which reduces the value of caching. Similarly, variables and values which are constant and not likely to change—or only likely to change slightly—signify low entropy, and thus suggest that caching may be valuable. The caching may be based on information content about the subgraph. The caching schemes may include, but are not limited to, Least Recently Used (LRU), Most Recently Used (MRU), Random Replacement (RR), their variants, and the like. Other caching schemes may be implemented, such as entropy-based caching. The entropy evaluation may include, but is not limited to, Shannon entropy. Entropy evaluations may be performed on problems. parameters, or a combination thereof. The degree of entropy (i.e. the amount of change) may be used to determine which problems and parameters remain M a cache for potential future use, and which problems and parameters may be flushed from the cache. Entropy, evaluations may be determined by as variety of techniques which may determine, for example, the uncertainty of a random variable. In embodiments, the entropy evaluation 186 may be based on changes in the random values of the random variables 186. The degree to which a random variable changes or plurality of variables change may determine A threshold of change may be set for a problem or parameter to help determine whether to maintain a problem or parameter in a cache or to Hush a problem or parameter from a cache. In embodiments, the entropy evaluation 186 may include Shannon entropy. In other embodiments, other entropy evaluation techniques may be implemented. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
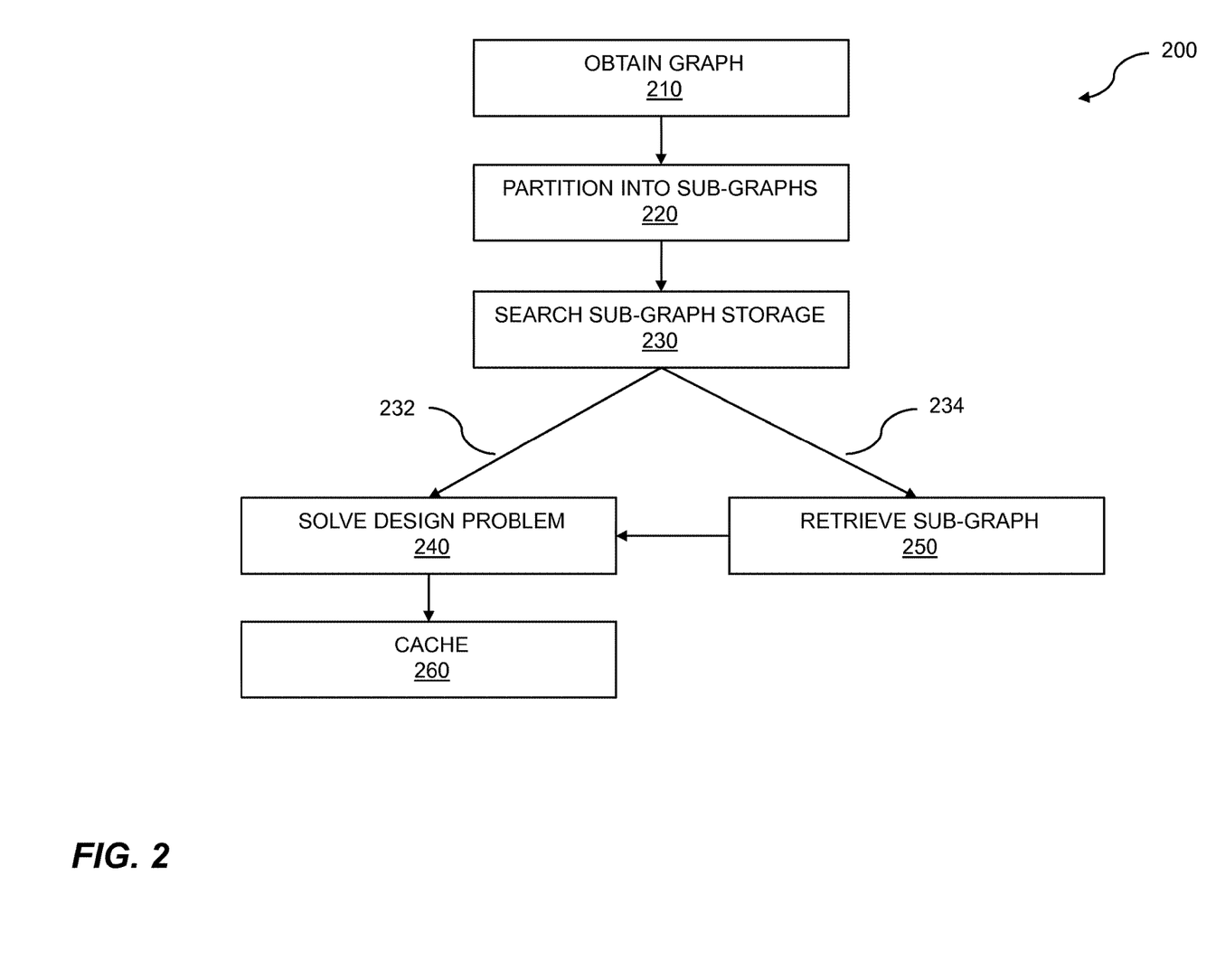
FIG. 2 is a flow showing subgraph search and retrieval.

FIG. 2 is a flow showing subgraph search and retrieval. A flow 200 may continue from or be part of flow 100. In some embodiments, the flow 200 may stand on its own and work from a pre-existing cache to determine a solution to a subgraph. The flow 200 may include obtaining a graph 210. A graph may be imported or extracted, generated by a computer aided design tool, generated by another computer-implemented tool, or otherwise obtained. A graph may be pre-loaded into a computer-aided tool. The graph may include details about a DUT. The graph may represent a subcircuit, circuit, subsystem, system, and so on. The graph may be described in a variety of languages including SPICE™, Verilog™, VHDL™, SystemVerilog™, SystemC™, and so on. The graph may include hierarchy information about a DUT or may be flattened. In a case where the hierarchy is flattened, all references in a hierarchy to components may be resolved a priori to reduce computational complexity and time.

The flow 200 may continue with partitioning a graph into one or more subgraphs 220. A graph may be large and complex depending on the size and complexity of the circuit or device it describes. The one or more partitions may group one or more logic components into a subgraph. The partitioning may be based on circuit or system hierarchy. The subgraphs may represent trees or subtrees of a graph. The partitioning may be based on a cut through the graph. A cut through a graph may be made to partition a graph into completely separate parts. The subgraphs may be of varying sizes which may be chosen for convenience of simulation. The one or more subgraphs may include portions of a semiconductor circuit including subcircuits, circuits, subsystems, systems, and so on. The partitioning may be accomplished after flattening the semiconductor circuit design. Flattening may involve resolving all references to logic cells, subsystems, systems and the like. Flattening a semiconductor circuit design may result in increased computation efficiency by reducing or eliminating calls to referenced cells. The subgraph may include portions of a DUT.

The flow 200 may further comprise searching through the subgraph storage 230 to identify a previously cached subgraph which matches a second design problem. A search may be undertaken based on variables, values, or other information. A successful search through subgraph storage may result in reduced computational requirements for simulation if a previously solved subgraph in storage may be reused. An efficient search may be accomplished to rapidly determine whether a given subgraph was previously stored in the cache. The search through the cache a hash scheme or other cache search method. The searching may include a search through the cache storage to identify a previously cached subgraph problem which may match the second subgraph problem. As previously discussed, various caching methods may be implemented which may include, but are not limited to, LRU, MRU, RR, and entropy-based caching.

The flow 200 may further comprise retrieving a solution 250 from subgraph storage for the previously cached subgraph which matches the second design problem. If a match is found between the second subgraph problem and a previously cached problem 234, then the previously cached subgraph problem may be retrieved. The retrieving may include obtaining from subgraph storage the previously cached subgraph or a representation of the subgraph. The solutions to the first subgraph problem and the second subgraph problem may be the same. The flow 200 may further comprise performing solving on the second design problem 240. The solving may be performed using the retrieved subgraph to evaluate the second constraint problem. The variables, values and information retrieved from the cached problem may be used to analyze the DUT. The flow may include performing solving on the second subgraph problem if a comparable, previously solved problem is not located in problem storage 232. The solving may generate variables, values, and information about the subgraph which was not previously stored. The flow may include caching a subgraph which was not previously stored 260. As stated above, numerous caching and data organization schemes exist. The caching schemes may include, but are not limited to Least Recently Used (LRU), Most Recently Used (MRU), Random Replacement (RR), their variants, and the like. Other caching schemes may be implemented, such as entropy-based caching. The entropy evaluation may include, but is not limited to, Shannon entropy. Various steps in the flow 200 may be changed in order, repeated, omitted, or the like without departing from the disclosed concepts. Various embodiments of the flow 200 may be included in a computer program product embodied in a non-transitory computer readable medium that includes code executable by one or more processors.

Figure 3:
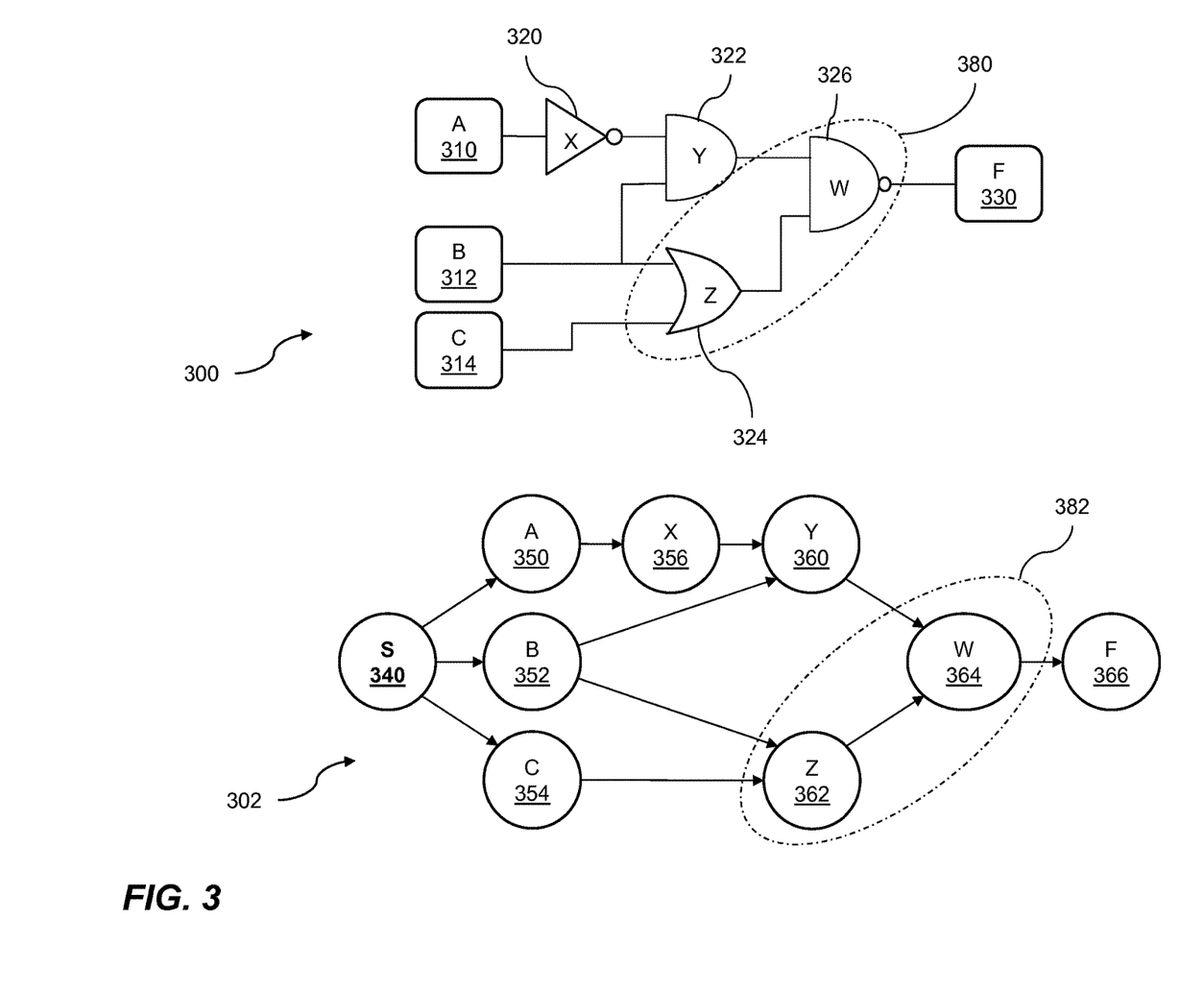
FIG. 3 is an example circuit and corresponding graph.

FIG. 3 is an example circuit and corresponding graph. An example circuit 300 is shown including various logic gates and interconnections. The circuit 300 includes three inputs—input A 310, input B 312, and input C 314—and an output F 330. In practice, any number of inputs and outputs may be present. Inputs and outputs may be included or excluded as appropriate to the circuit to which they are connected. The circuit further comprises various logic gates including a NOT gate X 320, an AND gate Y 322, an OR gate Z 324, and a NAND gate W 326. In practice, any number of logic gates, analog circuits, high frequency circuits, and the like may be present. The various gates are interconnected to form a circuit. Any circuit may be formed by interconnecting logic circuits, analog circuits, high frequency circuits, and so on. A circuit may be partitioned into one or more subcircuits 380. The example subcircuit 380 includes the OR gate Z 324 and the AND gate W 326. A partitioning of a circuit into one or more subcircuits may be based on structure, function, subsystem, repeated cells, or any other portioning scheme convenient to logic simulation.

A graph 302 corresponding to a circuit may be determined. An example graph 302 includes a start node S 340 and a finish node F 366. The start node may be connected to any number of nodes, while the finish node may be connected to one node. The graph may be any of a variety of graph forms convenient to circuit simulation and verification. A graph may be based on edges and nodes; arcs and vertices; tokens, places, and transitions; and so on. The determining of the graph may be based on logic components and connections among the logic components within the semiconductor circuit design. The graph may also be based on the numbers of inputs and outputs to and from the logic components within the semiconductor circuit's design. For example, the inputs to the circuit, A 310, B 312, and C 314, may correspond to nodes of the graph A 350, B 352, and C 354. Similarly, the output from the circuit F 330 may correspond to the node F 366. The various gates of the circuit may correspond to nodes in the graph. For example, the NOT gate X 320 may correspond to node X 356, the AND gate Y 322 to node Y 360, the OR gate Z 324 to node Z 362, and the NAND gate W 326 to node W 364. The edges of the graph may correspond to the interconnections amongst the gates. The edges may correspond to circuit elements. A graph may be partitioned into one or more subgraphs 382, where the subgraphs represent portions of the graphs. The subgraphs may represent trees of the graph. The graphs may be partitioned into subgraphs to reduce graph complexity, as subgraphs are smaller and may be more easily analyzed. The subgraphs may correspond to subcircuits. For example, a subcircuit 380 may be represented by a subgraph 382. In another example, one or more subgraphs may represent a circuit, or there may not be a one-to-one correspondence between circuit elements and subgraph elements.

Figure 4:
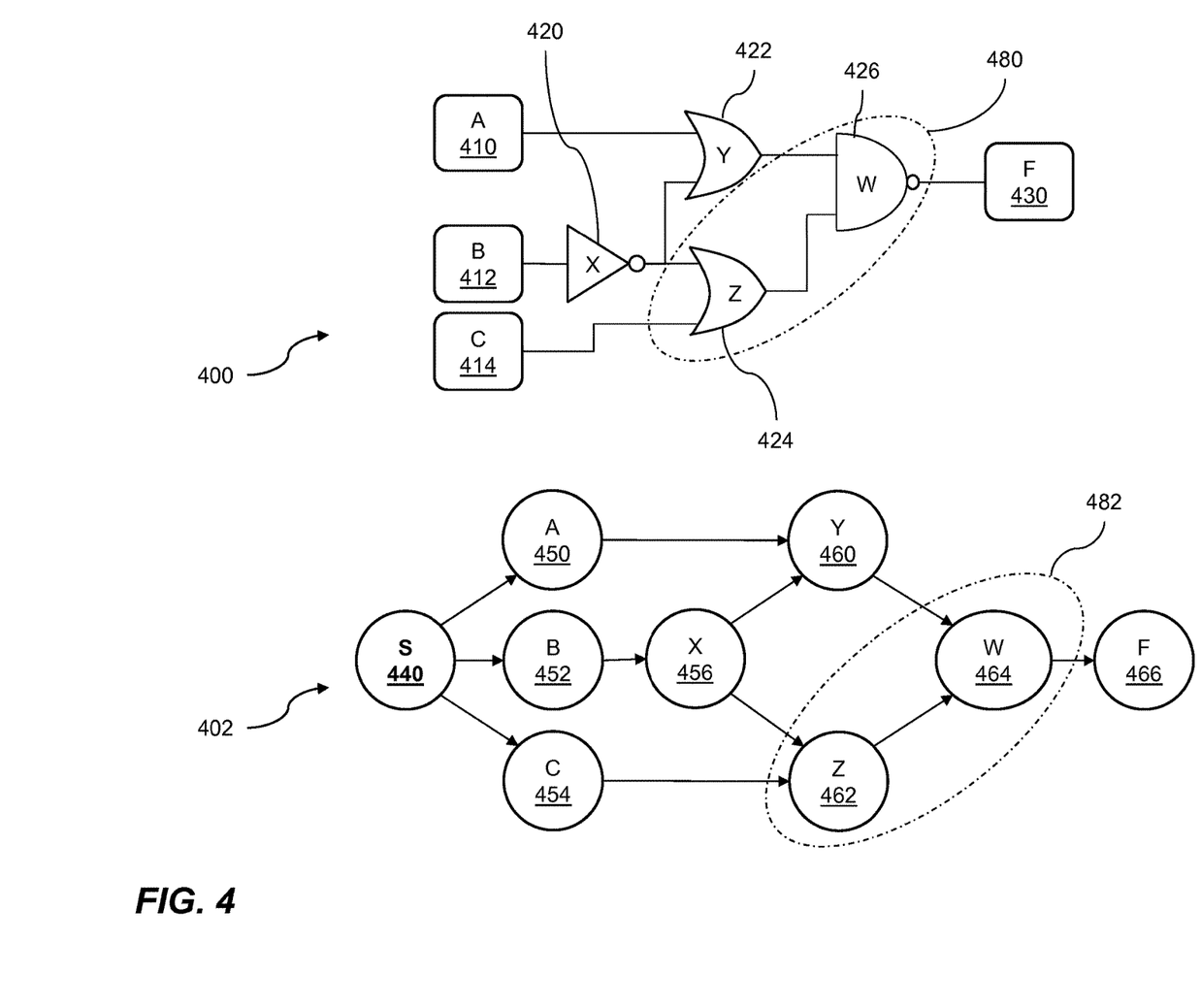
FIG. 4 is another example circuit and corresponding graph.

FIG. 4 is another example circuit and corresponding graph. An example circuit 400 is shown including various logic gates and interconnections. The example circuit may be substantially similar to or substantially different from another example circuit. The circuit 400 includes three inputs, input A 410, input B 412, and input C 414, and an output F 430. In practice, any number of inputs and outputs may be present. Inputs and outputs may, in general, be included or excluded as appropriate to the circuit to which they are connected. The circuit further includes various logic gates including a NOT gate X 420, an OR gate Y 422, an OR gate X 424, and a NAND gate W 426. In practice, any number of logic gates, analog circuits, high frequency circuits, and so on may be present. The various gates are interconnected to form a circuit. Any circuit may be formed by interconnecting logic circuits, analog circuits, high frequency circuits, and so on. A circuit may be partitioned into one or more subcircuits 480. The example subcircuit shown 480 includes the OR gate Z 424 and the AND gate W 426. A partitioning of a circuit into one or more subcircuits may be based on structure, function, subsystem, repeated cells, or any other portioning scheme convenient to logic simulation. It should be noticed that while circuit 400 and circuit 300 are similar, there are significant differences. For example, input B 412 is connected to the NOT gate X 420. The output of NOT gate 420 is connected to the inputs of OR gate Y 422 and OR gate Z 424. In circuit 300 these connections do not exist.

A graph 402 corresponding to a circuit may be determined. An example graph 402 includes a start node S 440 and a finish node F 466. The start node may be connected to any number of nodes, while a finish node may be connected to one node. The graph may be any of a variety of graph forms convenient to circuit simulation and verification. A graph may be based on edges and nodes; arcs and vertices; tokens, places, and transitions; and so on. The determining the graph may be based on logic components and connections between the logic components within the semiconductor circuit design. The graph may also be based on the numbers of inputs to and outputs from the logic components within the semiconductor circuit design. For example, the inputs to the circuit, A 410, B 412, and C 414, may correspond to nodes of the graph A 450, B 452, and C 454. Similarly, the output from the circuit, F 430, may correspond to the node F 466. The various gates of the circuit may correspond to nodes in the graph. For example, the NOT gate X 420 may correspond to node X 456, the OR gate Y 422 to node Y 460, the OR gate Z 424 to node Z 462, and the NAND gate W 426 to node W 464. The edges of the graph may correspond to the interconnections amongst the gates. The edges may correspond to circuit elements. A graph may be partitioned into one or more subgraphs 482, where subgraphs represent subsections of the graphs. The subgraphs may represent trees of the graph. Problems related to previously solved subgraphs may be stored in subgraph storage. The diagram 400 may include searching through the subgraph storage to identify a previously cached subgraph which matches a second design problem. The graphs may be partitioned into subgraphs to reduce graph complexity since subgraphs are smaller and may be more easily analyzed. The subgraphs may correspond to subcircuits. For example, a subcircuit 480 may be represented by a subgraph 482. In another example, one or more subgraphs may represent a subcircuit, or there may not be a direct correspondence between circuit elements and subgraph elements. Again, while graph 302 and graph 402 are similar, there are significant differences shown. Even though there are differences, the subgraph 382 and the subgraph 482 are similar. This similarity will be used in the next figures.

Figure 5:
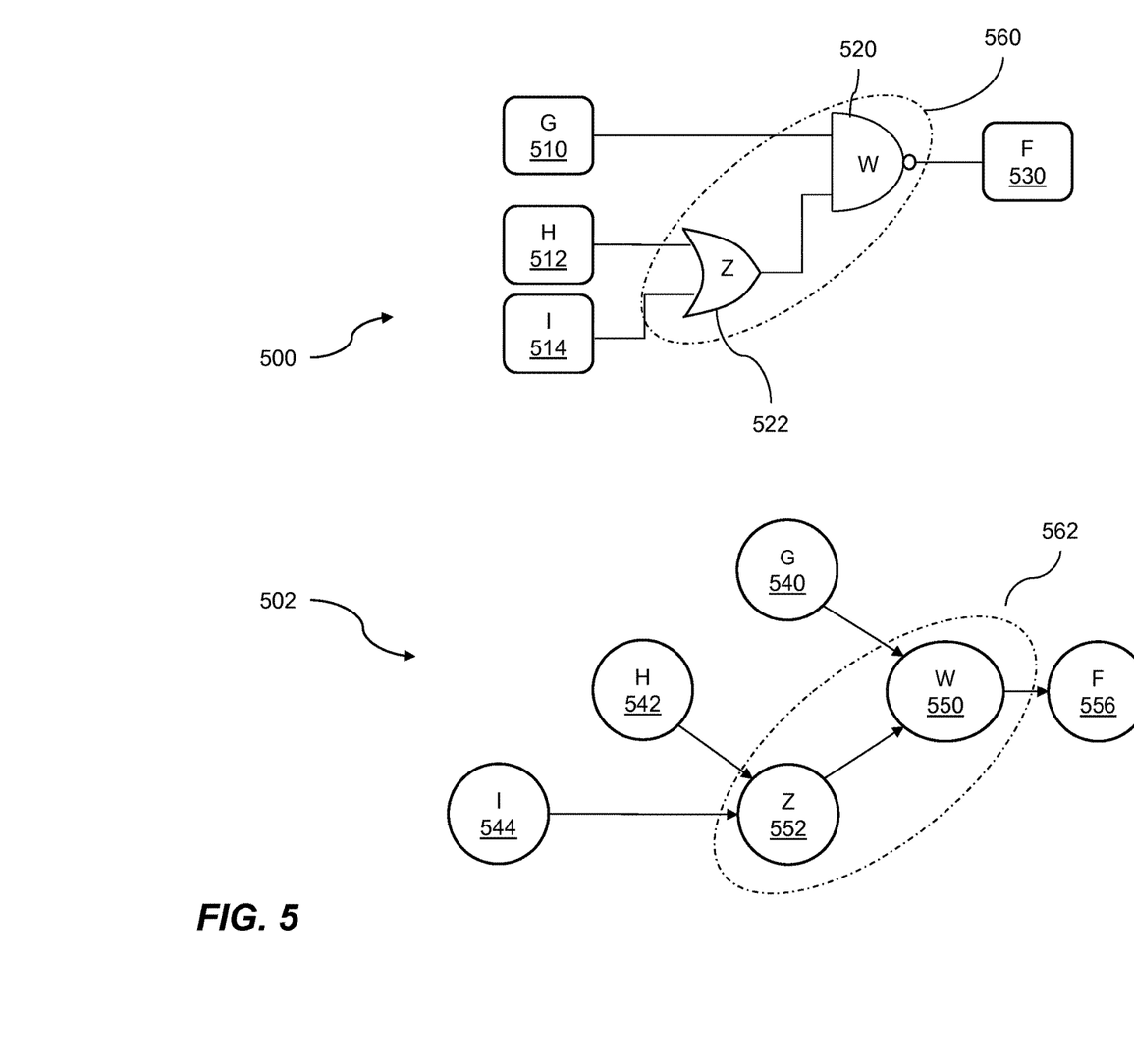
FIG. 5 is an example subcircuit and corresponding subgraph.

FIG. 5 is an example subcircuit and corresponding subgraph. A subcircuit 560 may be a portion of a larger circuit, subsystem, system, and so on that was partitioned into one or more subcircuits. A subcircuit may be a portion of a previously solved circuit or may be a new subcircuit to be solved. A subcircuit may be imported or extracted, generated by a computer aided design tool, generated by another computer-implemented tool, or otherwise obtained. The subcircuit 500 shown includes three inputs, input G 510, input H 512, and input I 514, and an output F 530. In practice, any number of inputs and outputs may be present. Inputs and outputs may in general be included or excluded as appropriate to the subcircuit to which they are connected. The subcircuit further comprises various logic gates including a NAND gate W 520 and an OR gate Z 522. In practice, any number of logic gates, analog circuits, high frequency circuits and so on may be present. The various gates are interconnected to form a subcircuit. Any subcircuit may be formed by interconnecting logic circuits, analog circuits, high frequency circuits, and so on. A subcircuit 560 may be based on structure, function, subsystem, repeated cells, or any other portioning scheme convenient to logic simulation. It should be noted that the logic configuration for subcircuit 560 corresponds to the subcircuit 380 and the subcircuit 480 previously discussed. Therefore a design problem which is solved for subcircuit 380 may be applicable to subcircuit 480.

A subgraph 502 corresponding to the subcircuit 560 may be determined. A subgraph 562 may be a portion of a larger graph. A subgraph may be a portion of a previously solved subgraph or may be a new subgraph to be solved. An example subgraph 502 may include a start node depending on the location of a subgraph within a graph. An example subgraph may include a finish node F 530, again depending on the location of a subgraph within a graph. A start node may be connected to any number of nodes, while a finish node may be connected to one node. One or more subgraphs result from partitioning a graph. The partitioning may group one or more logic components into a subgraph. The subgraph may be any of a variety of graph forms convenient to circuit simulation and verification. A subgraph may be based on edges and nodes; arcs and vertices; tokens, places, and transitions, and so on. The determining of the subgraph 502 may be based on logic components and connections between the logic components within the semiconductor subcircuit design. The determining may be based on nodes and arcs between nodes within a subgraph. The subgraph may also be based on the numbers of inputs and outputs to and from the logic components within the semiconductor subcircuit design. For example, the inputs to the subcircuit, G 510, H 512, and I 514, may correspond to nodes of the subgraph G 540, H 542, and I 544. Similarly, the output from the circuit F 530 may correspond to the node F 556. The various gates of the circuit may correspond to nodes in the graph. For example, the NAND gate W 520 may correspond to node W 550 and the OR gate Z 522 to node Z 552. The edges of the subgraph may correspond to the interconnections amongst the gates. The subgraph may represent trees of the graph. Problems related to previously solved subgraphs may be stored in subgraph storage. The diagram 500 may include searching through the subgraph storage to identify a previously cached subgraph which matches a second design problem. The graphs may be partitioned into subgraphs to reduce graph complexity since subgraphs are smaller and may be more easily analyzed. The subgraphs may correspond to subcircuits. For example, a subcircuit 560 may be represented by a subgraph 562. In another example, one or more subgraphs may represent a subcircuit, or there may not be a direct correspondence between circuit elements and subgraph elements. The subgraph 562 may represent corresponding subgraph 382 and subgraph 482. Thus, when graph 302 is solved, a solution for subgraph 382 may be placed into subgraph storage. Then, when graph 402 is being solved, a search may be made through subgraph storage for subgraphs similar to subgraphs 562. The solution for subgraph 482 may be found based on storage relating to subgraph 382. Therefore the solution for subgraph 382 may be retrieved from subgraph storage and the solution used to solve the design problem represented by graph 402. The design problem can be timing, power, area, or any other design problem represented using graph analysis. Information relating to delays through OR gate Z 522 and NAND gate W 520 may be stored in subgraphs storage as part of the information on subgraph 562. In this manner, similar problems do not need to be repeatedly solved but instead can be retrieved after being solved once and then stored.

The results of a simulation may be examined to identify key variables which may be critical to a particular problem or a plurality of problems. Identification of key variables and values may assist in determining whether a particular problem has been solved and cached previously, or whether it may be cached at a given stage in the simulation process. Continuing, a value for entropy may be computed, The computed value for entropy may assist in determining whether key variables are changing, and if so, by how much. In embodiments, caching may be based on entropy evaluation of the information. The entropy evaluation may include Shannon entropy. Based on entropy values, a determination may be made whether to cache key variables and values for additional (i.e. future) use. For example, in the event that key variables identified may have low entropy and are therefore not changing much, and if those variables meet other caching criteria—such as a relatively high frequency of occurrence—then the variables and values may be cached for later use. Variables with low entropy that meet other caching criteria may be compressed 540. In embodiments. the compression may be based on a state-to-state transformation. In embodiments. the compression may result in orders of magnitude reduction in cardinality of an indexing function. After compression, variables and values of interest may be cached for future use. In embodiments, caching may be based on a prefix. If key variables identified have high entropy and are therefore changing frequently and may occur with relatively low frequency, then the variables and values may not be cached for future use. For example, the variables may be used once and may then be discarded.

Figure 6:
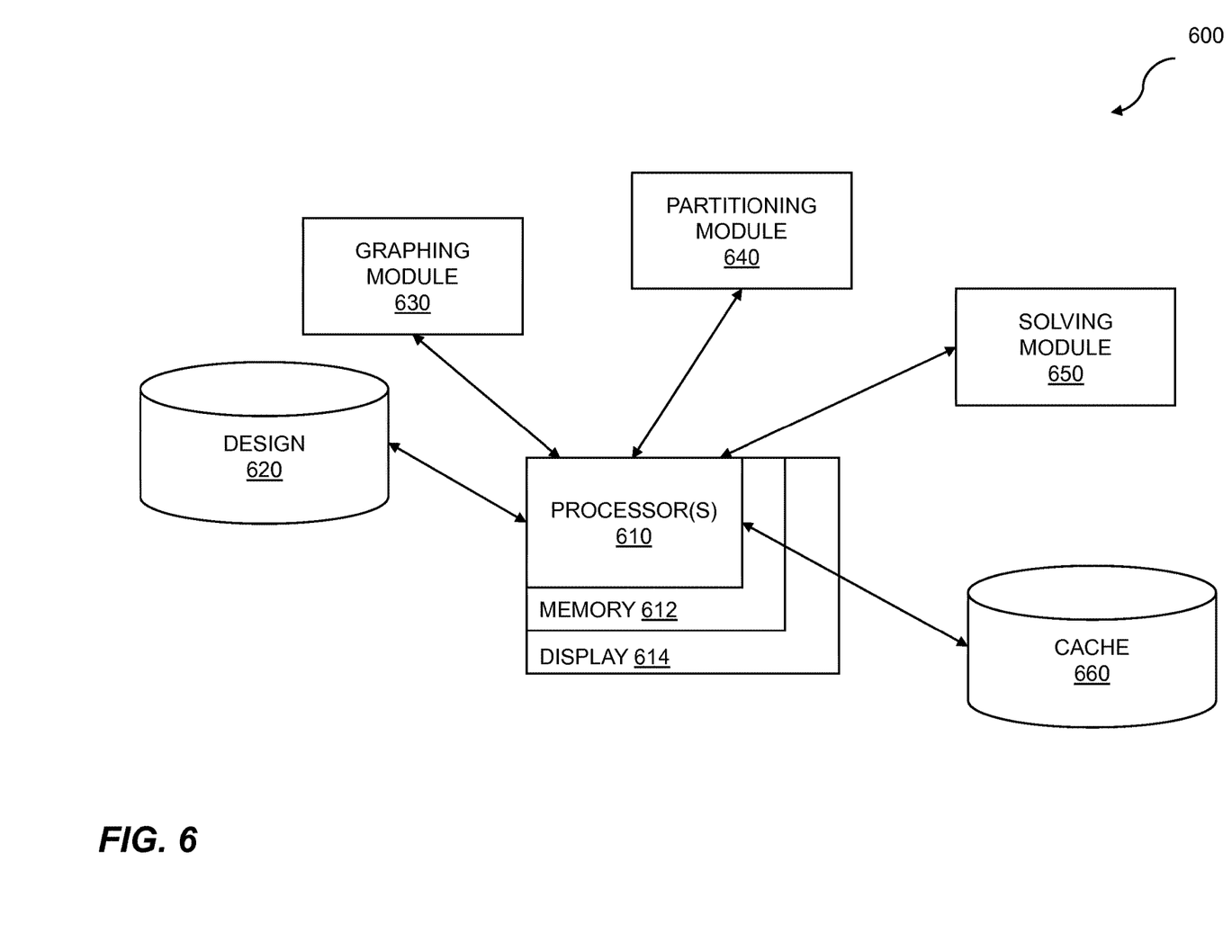
FIG. 6 is a system diagram for subgraph caching.

FIG. 6 is a system diagram for subgraph caching. The system diagram shows a computer system 600 for design analysis. A system 600 includes one or more processors 610 as well as a design 620, a graphing module 630, a partitioning module 640, a solving module 650 and a cache 660. In at least one embodiment, the one or more processors 610 may accomplish the graphing, partitioning, and solving functions. The one or more processors may be configured to determine a graph for a semiconductor circuit design, partition the graph into subgraphs, solve a design problem for one or more subgraphs, and cache information on the one or more subgraphs into subgraph storage. The one or more processors may be coupled to a memory 612 which stores instructions, system support data, intermediate data, analysis data, help information, and the like. The one or more processors may be coupled to an electronic display 614. The display may be any electronic display, including but not limited to, a computer display, a laptop screen, a net-book screen, a tablet computer screen, a cell phone display, a mobile device display, a remote with a display, a television, a projector, or the like.

The one or more processors 610 may load information on a design 620. The design may describe any type of design and may include a semiconductor subcircuit, circuit, subsystem, system, and the like. The design information may contain various types of information about the design including a structural description of the design, timing requirements, power requirements, thermal requirements, area requirements, routing requirements, and so on. Design information may be in the form of a hardware description language or any other form suitable to describing a design. For example, a semiconductor circuit may be in the form of a hardware description language including Verilog™, SystemVerilog™, VHDL™, and so on.

A graphing module 630 may determine a graph for a semiconductor circuit design or another design. The form of the graph may be any graphical form appropriate to represent the semiconductor circuit's design. For example, a graph consisting of edges and nodes; arcs and vertices; places, tokens, and transitions; or other graphical form may represent a semiconductor design or another design. Elements may be added to or removed from a graph to improve the graphical representation of a circuit. Start and finish nodes may be added to a graph for various purposes, including verification. A graph representing a semiconductor circuit may be partitioned into subgraphs by a partitioning module 640. A subgraph may represent a subcircuit, circuit, subsystem, or system of a semiconductor circuit. The subgraph may represent a common component of a circuit, subsystem, or system, for example. A graph may be partitioned into one or more subgraphs. A solving module 650 may solve the one or more subgraph problems. The solving may include determining logical values, timing values, power consumption values, heat dissipation values, and so on. The solved design problem or plurality of design problems may be cached 660. One or more caching algorithms may be used for the caching. Caching may be performed by any method appropriate to caching of semiconductor designs or other designs.

A subgraph of a design problem may be cached. A solved design problem may be cached. A cached subgraph or cached design problem may be retrieved from a cache to enable design reuse, to simplify design problem solving, to improve computational efficiency, and so on. As previously discussed, various caching methods may be implemented which may include, but are not limited to, LRU, MRU, RR, and entropy-based caching. Entropy-based caching may be based on Shannon Entropy. The system 600 may include a computer program product embodied in a non-transitory computer-readable medium for design analysis. The computer program product may include code for determining a graph for a semiconductor circuit design, code for partitioning the graph into subgraphs, code for solving a design problem for one or more subgraphs, and code for caching information on the one or more subgraphs into subgraph storage. The system 600 may implement a method for design analysis comprising: determining a graph for a semiconductor circuit design wherein the graph describes interaction between logic components within the semiconductor circuit design; partitioning the graph into subgraphs where the subgraphs describe portions of the semiconductor circuit design; solving a design problem for one or more subgraphs within the semiconductor circuit design; caching information on the one or more subgraphs into subgraph storage; searching through the subgraph storage to identify a previously cached subgraph which matches a second design problem; and retrieving a solution, from subgraph storage, for the previously cached subgraph which matches the second design problem wherein the solution is used to solve an overall design problem for the semiconductor circuit design.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for building a cache of computation design problem solution data relating to a design of a semiconductor circuit, the method comprising:
    mapping the semiconductor circuit design to generate a computer-generated graph for the semiconductor circuit design;
    partitioning the computer-generated graph into subgraphs;
    generating solution data by computationally solving a computational design problem for each of one or more subgraphs;
    evaluating an entropy of information content for the one or more subgraphs based at least in part on changes of the information content;
    determining, based at least in part on the evaluated entropy of the information content, whether caching criteria are satisfied for each of the one or more subgraphs, wherein the caching criteria identify a threshold of change indicated by the evaluated entropy for caching solution data for the computational design problem;
    determining whether to cache the solution data for the computational design problem based on whether the caching criteria are satisfied;
    upon determining that the caching criteria are satisfied for at least one of the one or more subgraphs and determining to cache the solution data for the computational design problem, caching the solution data on the at least one of the one or more subgraphs into subgraph storage, wherein: (i) the solution data about the at least one of the one or more subgraphs includes variables and values for the variables; and (ii) the caching is based on the evaluated entropy of information content about the one or more subgraphs;
    searching, using one or more processors, through the subgraph storage to identify previously cached solution data for a subgraph based at least in part on a second design problem;
    retrieving solution data, from the subgraph storage, for the previously cached solution data for the second design problem; and
    solving the second design problem based at least in part on the retrieved solution data.

2. The method of claim 1 wherein the mapping is based on logic components and connections between the logic components within the semiconductor circuit design.

3. The method of claim 1 wherein the design problem includes one or more of timing, power, or area.

4. The method of claim 1 wherein the partitioning groups one or more logic components into a subgraph.

5. The method of claim 4 wherein the partitioning is based on hierarchy.

6. The method of claim 4 wherein the partitioning is accomplished after flattening of the semiconductor circuit design.

7. The method of claim 4 wherein the partitioning is based on a cut through the graph.

8. The method of claim 1 wherein the variables and the values are applied through a hierarchy within the semiconductor circuit design and wherein the solution data which is cached is selected based on a frequency with which the variables are used.

9. The method of claim 1 wherein the solution data about the at least one of the one or more subgraphs includes information on one or more of timing, power, or area.

10. The method of claim 9 wherein the solution data on timing includes one or more of setup time, hold time, access time, or cycle time.

11. The method of claim 10 wherein the design problem includes analysis of arrival time and slack time.

12. The method of claim 9 wherein the solution data on power includes one or more of standby power, leakage power, dynamic power, power-down power, or static power.

13. The method of claim 9 wherein the solution data on area includes one or more of metallization area, diffusion area, or polysilicon area.

14. The method of claim 1 wherein the information content is based on evaluating changes in the information content.

15. The method of claim 1 wherein the entropy evaluation includes Shannon entropy.

16. The method of claim 1 further comprising obtaining the design for which a graph is to be determined.

17. The method of claim 1 further comprising caching solution data for a subgraph which was not previously stored.

18. The method of claim 1 wherein the one or more subgraphs each represent a circuit.

19. The method of claim 1 wherein there is not a one-to-one correspondence between circuit elements and subgraphs.

20. A computer-implemented method for building a cache of computation design problem solution data relating to a design of a semiconductor circuit, the method comprising:
    mapping the semiconductor circuit design to generate a computer-generated graph for the semiconductor circuit design, wherein the graph describes interaction between logic components within the semiconductor circuit design;

partitioning the computer-generated graph into subgraphs where the subgraphs describe portions of the semiconductor circuit design;

generating solution data by computationally solving a computational design problem for each of one or more subgraphs within the semiconductor circuit design;

evaluating an entropy of information content for the one or more subgraphs based at least in part on changes of the information content;

determining, based at least in part on the evaluated entropy of the information content, whether caching criteria are satisfied for each of the one or more subgraphs, wherein the caching criteria identify a threshold of change indicated by the evaluated entropy for caching solution data for the computational design problem;

determining whether to cache the solution data for the computational design problem based on whether the caching criteria are satisfied;

upon determining that the caching criteria are satisfied for at least one of the one or more subgraphs and determining to cache the solution data for the computational design problem, caching the solution data on the at least one of the one or more subgraphs into subgraph storage, wherein: (i) the solution data about the at least one of the one or more subgraphs includes variables and values for the variables; and (ii) the caching is based on the evaluated entropy of information content about the one or more subparagraphs;

searching through the subgraph storage to identify previously cached solution data for a subgraph based at least in part on a second design problem;

retrieving solution data, from the subgraph storage, for the previously cached solution data for the second design problem; and solving the second design problem for the semiconductor circuit design based at least in part on the retrieved solution data.

21. A computer system for building a cache of computation design problem solution data relating to a design of a semiconductor circuit, the system comprising:
a memory which stores instructions;
one or more processors coupled to the memory wherein the one or more processors are configured to:
map the semiconductor circuit design to generate a computer-generated graph for the semiconductor circuit design;
partition the computer-generated graph into subgraphs;
generating solution data by computationally solving a computational design problem for each of one or more subgraphs;
evaluate an entropy of information content for the one or more subgraphs based at least in part on changes of the information content;
determine, based at least in part on the evaluated entropy of the information content, whether caching criteria are satisfied for each of the one or more subgraphs, wherein the caching criteria identify a threshold of change indicated by the evaluated entropy for caching solution data for the computational design problem;
determine whether to cache the solution data for the computational design problem based on whether the caching criteria are satisfied;
upon determining that the caching criteria are satisfied for at least one of the one or more subgraphs and determining to cache the solution data for the computational design problem, cache the solution data on the at least one of the one or more subgraphs into subgraph storage, wherein (i) the solution data about the at least one of the one or more subgraphs includes variables and values for the variables; and (ii) the caching is based on the evaluated entropy of information content about the one or more subgraphs;
search through the subgraph storage to identify previously cached solution data for a subgraph based at least in part on a second design problem;
retrieve solution data, from the subgraph storage, for the previously cached solution data for the second design problem; and
solve the second design problem based at least in part on the retrieved solution data.

22. The computer system of claim 21, wherein the solution data about the at least one of the one or more subgraphs includes information on one or more of timing, power, or area.

23. The computer system of claim 22 wherein the solution data on timing includes one or more of setup time, hold time, access time, or cycle time.

24. A computer program product embodied in a non-transitory computer readable medium, which when executed by a processor, causes the processor to build a cache of computation design problem solution data relating to a design for a semiconductor circuit, the computer program product comprising instructions that when executed cause the processor to:
map the semiconductor circuit design to generate a computer-generated graph for the semiconductor circuit design;
partition the computer-generated graph into subgraphs;
generating solution data by computationally solving a computational design problem for each of one or more subgraphs;
evaluate an entropy of information content for the one or more subgraphs based at least in part on changes of the information content;
determine, based at least in part on the evaluated entropy of the information content, whether caching criteria are satisfied for each of the one or more subgraphs, wherein the caching criteria identify a threshold of change indicated by the evaluated entropy for caching solution data for the computational design problem;
determine whether to cache the solution data for the computational design problem based on whether the caching criteria are satisfied;
upon determining that the caching criteria are satisfied for at least one of the one or more subgraphs and determining to cache the solution data for the computational design problem, cache the solution data on the at least one of the one or more subgraphs into subgraph storage, wherein: (i) the solution data about the at least one of the one or more subgraphs includes variables and values for the variables; and (ii) the caching is based on the evaluated entropy of information content about the one or more subparagraphs;
search through the subgraph storage to identify previously cached solution data for a subgraph based at least in part on a second design problem;
retrieve solution data, from the subgraph storage, for the previously cached solution data for the second design problem; and solve the second design problem based at least in part on the retrieved solution data.

25. The computer program product of claim 24 wherein the solution data about the at least one of the one or more subgraphs includes information on one or more of timing, power, or area.

26. The computer program product of claim 25 wherein the solution data on timing includes one or more of setup time, hold time, access time, or cycle time.

* * * * *